United States Patent [19]
Cass et al.

[11] Patent Number: 5,102,863
[45] Date of Patent: Apr. 7, 1992

[54] PROCESS FOR PRODUCING CLAD SUPERCONDUCTIVE MATERIALS

[75] Inventors: Richard B. Cass, Ringoes, N.J.; Kevin C. Ott; Dean E. Peterson, both of Los Alamos, N. Mex.

[73] Assignee: The United States of America as represented by the United States Department of Energy, Washington, D.C.

[21] Appl. No.: 671,231

[22] Filed: Mar. 19, 1991

[51] Int. Cl.$^5$ ............................................. H01B 12/00
[52] U.S. Cl. ........................................... 505/1; 419/8; 419/19; 419/66; 505/704; 505/736; 505/807; 505/813; 505/822; 505/823
[58] Field of Search .................. 419/8, 19, 66; 505/1, 505/704, 736, 807, 813, 822, 823

[56] References Cited

U.S. PATENT DOCUMENTS 4,877,768  10/1989  Ziolo ........................................ 505/1

Primary Examiner—Stephen J. Lechert, Jr.
Attorney, Agent, or Firm—Bruce H. Cottrell; Paul D. Gaetjens; William R. Moser

[57] ABSTRACT

A process for fabricating superconducting composite wire by the steps of placing a superconductive precursor admixture capable of undergoing a self propagating combustion in stoichiometric amounts sufficient to form a superconductive product within a metal tube, sealing one end of said tube, igniting said superconductive precursor admixture whereby said superconductive precursor admixture endburns along the length of the admixture, and cross-section reducing said tube at a rate substantially equal to the rate of burning of said superconductive precursor admixture and at a point substantially planar with the burnfront of the superconductive precursor mixture, whereby a clad superconductive product is formed in situ, the product characterized as superconductive without a subsequent sintering stage, is disclosed.

11 Claims, No Drawings

PROCESS FOR PRODUCING CLAD SUPERCONDUCTIVE MATERIALS

FIELD OF THE INVENTION

The present invention relates to the field of high temperature superconductors. This invention is the result of a contract with the Department of Energy (Contract No. W-7405-ENG-36).

BACKGROUND OF THE INVENTION

Since the discovery of high temperature superconductive materials in the late 1980's, there has been a desire to form such materials into wires or similar shapes. Ideally, such wires must be strong, flexible, highly conductive and able to withstand strong magnetic fields without loss of their current carrying capacity. Such properties have not yet been totally achieved, although current methods such as "powder in a tube" and "viscous suspension spinning" have achieved some success.

For example, U.S. Pat. No. 4,983,576 issued to Hagino et al. describes the general process of fabricating superconductive wire by initially preparing a superconductive powder, filling a pipe or tube of silver with the superconductive powder, sealing the pipe or tube, subjecting the pipe or tube to drawing operations to form wire, and finally sintering the drawn wire. Additionally, they describe their improvement in such a process wherein the pipe or tube in which the superconductive powder is placed includes both a silver portion and a non-silver portion.

An object of this invention to provide a process for fabricating a clad superconductive body, e.g., a clad superconductive wire or tape.

SUMMARY OF THE INVENTION

To achieve the foregoing and other objects, and in accordance with the purposes of the present invention, as embodied and broadly described herein, the present invention provides a process for fabricating a superconducting composite body such as a wire or tape including placing a superconductive precursor admixture capable of undergoing self propagating combustion in stoichiometric amounts sufficient to form a superconductive product within an oxygen-porous metal tube, sealing one end of said tube, igniting said superconductive precursor admixture whereby said superconductive precursor admixture endburns along the length of the admixture and, cross-section reducing said tube at a rate substantially equal to the rate of endburning of said superconductive precursor admixture and at a point substantially planar with the burnfront of the self propagating superconductive precursor mixture whereby a clad superconductive product is formed in situ. The resultant product can be characterized as superconductive without requiring a subsequent high temperature sintering stage, i.e., a sintering period at temperatures from about 800° C. to about 1000° C.

DETAILED DESCRIPTION

The present invention involves inserting superconductive precursor materials including one or more metal precursors, e.g., copper metal, and one or more appropriate peroxide precursors into an oxygen-porous metal tube of an appropriate cladding metal such as silver, compacting the superconductive precursor materials to a predetermined density, igniting the compacted superconductive precursor materials whereby the precursor materials endburn linearly down the length of the tube, and cross-section reducing, e.g., swaging or drawing, the clad superconductive precursor materials at or near the time such materials are burning. The admixture of superconductive precursor materials can be characterized as capable of undergoing a self propagating combustion. The present process should allow relatively rapid processing of the materials into a wire-form and yield an oriented crystalline form expected to have good flexibility, high critical transition temperatures ($T_c$'s), i.e., from about 90° Kelvin (K) to about 117° K, practical critical current densities ($J_c$'s), i.e., from about 100 amps/cm$^2$ to about 1,000,000 amps/cm$^2$, and high critical magnetic field strengths ($H_c2$'s), i.e., up to about 30 Tesla. The wire-form can be subsequently subjected to a rolling operation to yield a superconductive tape with similar properties.

The suitable superconductive precursor materials may include any such admixture of materials capable of undergoing a self propagating combustion. By "self propagating combustion" is meant that the admixture will undergo an exothermic chain reaction. Further, this self propagating combustion may result in dynamic compaction of the superconductive precursor admixture, i.e., as the materials are contained within the cladding material, the exothermic reaction will result in increased pressure within the tube thereby forcing compaction into the dimensions within the tube.

The suitable superconductive precursor admixtures considered useful for the present process may include admixtures for the superconductive compositions including either bismuth or thallium as a component or admixtures for the well known yttrium-barium-copper (1-2-3) superconductive composition or Bismuth-containing admixtures may be preferred over thallium-containing admixtures due to the difficulties of working with thallium materials. Further, bismuth-containing admixtures may be preferred over the admixtures for the 1-2-3 materials due to the generally elongated grain structures of such bismuth compositions. Metal precursors may be, e.g., copper, bismuth or calcium. Oxygen rich precursors employable as oxidants may be, e.g., strontium peroxide or calcium peroxide. For example, a preferred combination includes stoichiometric amounts of copper metal, bismuth trioxide, strontium peroxide, calcium metal and lead oxide to produce a bismuth-containing superconductive composition generally referred as the 2-2-2-3 type, more specifically such a composition being within about

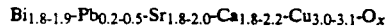

$$Bi_{1.8-1.9}\text{-}Pb_{0.2-0.5}\text{-}Sr_{1.8-2.0}\text{-}Ca_{1.8-2.2}\text{-}Cu_{3.0-3.1}\text{-}O_x$$

in composition. Other possible combinations include mixtures designed to yield a bismuth-containing superconductive composition generally referred as the 2-2-1-2 type, more specifically such a composition being within about

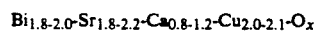

$$Bi_{1.8-2.0}\text{-}Sr_{1.8-2.2}\text{-}Ca_{0.8-1.2}\text{-}Cu_{2.0-2.1}\text{-}O_x$$

in composition. Such precursor materials are by appropriate means such as ball milling to a fine particle size. The precursor materials should be pulverized and mixed under anaerobic conditions, e.g., under nitrogen to avoid premature ignition. The precursor admixture is then placed in stoichiometric amounts sufficient for the production of a superconductive material into the metal tube. In order to minimize possible shrinkage during the later combustion or burning stage and cross-section reducing stage, the superconductive precursor admixture is compacted within the tube or may be compacted prior to insertion into the tube. Further compaction may result from the self propagating combustion. Generally, the particle size of the superconductive precursor admixture is within the range from about 0.1 microns to about 10 microns, preferably from about 0.4 microns to about 1.5 microns.

The superconductive precursor mixture can also include a minor amount of superconductive material chemically equivalent to the superconductive material to be formed by the superconductive precursor admixture. Such pre-existing superconductive material may be added as a burn modifier to assist in the rate of burning of the precursor materials. By "minor amount" is meant amounts from about 1 to about 49% by weight based on the total weight of precursor materials, preferably from about 1 to about 20% by weight, and more preferably from about 1 to about 5% by weight.

The appropriate cladding metal should have a porosity or permeability to oxygen sufficient to allow the passage of oxygen through the tube walls at temperatures in the range of about 800° C. to about 1000° C., such temperatures generally occurring during the burning of the superconductive precursor materials after ignition of the precursor admixture. Among suitable metals for the cladding metal are included silver, gold, gold-plated silver, and may include silver or gold alloys such as silver-nickel alloys, silver-gold alloys, or copper-gold alloys. The selection of the cladding metal should help minimize interactions between the resultant superconductive material and the cladding. Silver is especially preferred as the cladding metal. The particular cladding metal may further be clad or covered by a secondary support metal such as, e.g., stainless steel, such secondary support metal providing additional support for the entire clad composite during the cross-section reducing process. This may be particularly preferred as the cross-section reducing, e.g., drawing, occurs approximately at the interface or burnfront of the endburning superconductive precursor admixture as the admixture self propagates within the metal tube.

The ignition of the superconductive precursor admixture may be by any appropriate means such as by a spark to ignite the oxygen rich admixture. The admixture should then burn linearly along the length of the filled tube in an endburning or cigarette type burn. By "endburning" is meant that the precursor admixture burns in a plane perpendicular to the longitudinal axis of the tube. The endburning nature of the admixture can be controlled by proper selection of particle size, adequate mixing and proper compaction.

The cross-section reducing process can involve any suitable means for reducing the diameter of the filled tube, e.g., by drawing or swaging. Drawing is preferred as the method of cross-section reduction. For example, the drawing can be accomplished by passing the filled tube though a suitable die. In the cross-section reducing stage of the present process, the tube can be drawn though, e.g., a die, at approximately the same rate as the burning rate of the superconductive precursor admixture and the filled tube is drawn through the die at approximately the same time as that portion of the tube is undergoing burning whereby temperatures in the range of about 800° C. to about 1000° C. are occurring, more preferably temperatures in the range of about 875° C. to about 925° C. In one manner of practicing the invention, a metal tube filled with the superconductive precursor materials can be initially reduced in cross-section by one or more drawing operations to form an elongated/reduced body. The elongated/reduced body can then undergo a final cross-section reduction or drawing as the superconductive precursor admixture is ignited and burned.

Following the self propagating combustion of the precursor mixture and the concurrent cross section reduction to obtain the superconductive wire in situ, the superconductive wire may be annealed at temperatures and for time sufficient to relieve internal stresses. Such times and temperatures are generally on the order of from a few minutes up to an hour and from about 200° C. to about 600° C. Such conditions are not to be confused with the conventional high temperature (800° C.-1000° C.) sintering processes that generally took several hours.

The present invention is more particularly described in the following examples which are intended as illustrative only, since numerous modifications and variations will be apparent to those skilled in the art.

EXAMPLE 1

A clad superconductive tape is formed by ballmilling under nitrogen a stoichiometric mixture of copper metal, bismuth oxide, strontium peroxide, calcium oxide and lead oxide, such stoichiometric mixture in amounts calculated to yield the Bi-Pb-Sr-Ca-Cu-O superconductive system. The resultant precursor mixture is placed into a silver tube about 6 inches in length and having an outer diameter of 6 millimeters (mm) and an inner diameter of 3 mm. The mixture is compacted and one end of the tube is sealed. The other end of the tube is swaged in order to initially fit through a die and the tube is drawn in a reducing step. This reducing process is repeated several times (about 10 to 15% reduction per step) until the filled metal tube has an outer diameter of about 1.15 mm. The superconductive precursor admixture is then ignited by a spark through the open end of the tube and the open end of the tube is entered into a die of the drawing process. The die is heated at about 500° C. to reduce the transfer of heat from the burning precursor mixture. The tube is drawn at a rate equal to the rate of the endburning of the precursor mixture and the drawing is controlled so that the tube is drawn at the time or immediately after the time that the adjacent precursor mixture burns.

Although the present invention has been described with reference to specific details, it is not intended that such details should be regarded as limitations upon the scope of the invention, except as and to the extent that they are included in the accompanying claims.

What is claimed is:

1. A process for fabricating superconducting composite wire or tape comprising:
    placing a superconductive precursor admixture capable of undergoing self propagating combustion in stoichiometric amounts sufficient to form a superconductive product within an oxygen-porous metal tube;
    sealing one end of said tube;
    igniting said superconductive precursor admixture whereby said superconductive precursor admixture endburns along the length of the admixture; and, cross-section reducing said tube at a rate substantially equal to the rate of burning of said superconductive precursor admixture and at a point substantially planar with the burnfront of the superconductive precursor mixture, whereby a clad superconductive product is formed in situ.

2. The process of claim 1 wherein the superconductive precursor admixture includes copper metal, a bismuth oxide, strontium peroxide, a calcium oxide, and lead oxide.

3. The process of claim 2 wherein the superconductive precursor admixture further includes a minor amount of superconductive material, said superconductive material chemically equivalent to the superconductive material to be formed by the superconductive precursor admixture.

4. The process of claim 1 wherein said tube is drawn down to an intermediate reduced size before ignition of the superconductive precursor admixture.

5. The process of claim 1 wherein the metal tube is selected from the group consisting of silver, or gold.

6. The process of claim 1 wherein the temperature of the admixture during the endburning and reducing is at temperatures from about 875° C. to about 925° C.

7. The process of claim 1 wherein a multiple of drawn tubes containing said superconductive precursor admixture are placed in the metal tube.

8. The process of claim 7 wherein said multiple of drawn tubes are braided prior to placement in said metal tube.

9. The process of claim 1 wherein said superconductive precursor mixture is compacted prior to placement within said metal tube.

10. The process of claim 1 wherein said superconductive precursor mixture is compacted after placement within said metal tube.

11. The process of claim 2 wherein the bismuth oxide is bismuth trioxide.

* * * * *